United States Patent [19]

Koinuma et al.

[11] Patent Number: 4,933,300

[45] Date of Patent: Jun. 12, 1990

[54] PROCESS FOR FORMING MULTILAYER THIN FILM

[75] Inventors: Hideomi Koinuma, No. 17-6, Ogikubo 4-chome, Suginami-ku, Tokyo; Kazuo Fueki; Masashi Kawasaki, both of Tokyo, all of Japan

[73] Assignees: Hideomi Koinuma; Bridgestone Corporation, both of Tokyo, Japan

[21] Appl. No.: 155,546

[22] Filed: Feb. 12, 1988

[30] Foreign Application Priority Data

Feb. 12, 1987 [JP] Japan ................... 62-30799

[51] Int. Cl.$^5$ ........................... H01L 21/265
[52] U.S. Cl. ................... 437/110; 437/100; 437/173; 437/170; 437/81
[58] Field of Search ............ 437/110, 101, 81, 82, 437/225, 173, 174; 148/DIG. 160

[56] References Cited

U.S. PATENT DOCUMENTS

| 4,659,401 | 4/1987 | Reif ........................ 437/110 |
| 4,705,912 | 11/1987 | Nakashima ............... 437/110 |
| 4,719,123 | 1/1988 | Hakn et al. ............... 437/101 |
| 4,726,963 | 2/1988 | Ishihara .................... 437/238 |

FOREIGN PATENT DOCUMENTS

| 110772 | 9/1986 | Japan . |
| 0222219 | 10/1986 | Japan .................. 437/110 |
| 0222220 | 10/1986 | Japan .................. 437/110 |
| 214619 | 9/1987 | Japan . |

OTHER PUBLICATIONS

Kawasaki et al, Nature (1988), 331 (6152); 153-155.
News and Views, Nature vol. 331, Jan. 14, 1988, p. 16, Making Multilayered Samples.

Primary Examiner—Brian E. Hearn
Assistant Examiner—Kevin McAndrews
Attorney, Agent, or Firm—Oblon, Spivak, McClelland, Maier & Neustadt

[57] ABSTRACT

A superlattice film is formed by introducing a mixture of a first gas reactant capable of only plasma-excited chemical reaction and a second gas reactant capable of both plasma-excited chemical reactions into a reaction chamber, discontinuously carrying out plasma-excited chemical reaction, and continuously carrying out light-excited chemical reaction, thereby alternately depositing on a substrate a thin film layer which is formed when the plasma- and light-excited chemical reactions are carried out and another thin film layer which is formed when the plasma-excited chemical reaction is interrupted, thereby forming a thin film of alternately deposited layers.

22 Claims, 2 Drawing Sheets

PROCESS FOR FORMING MULTILAYER THIN FILM

BACKGROUND OF THE INVENTION

1. Field of the Invention

This invention relates to a process for forming multilayer thin films, such as amorphous semiconductor superlattices.

2. Discussion of the Background

Development of amorphous semiconductor thin films is now in progress toward its commercial application to solar cells, thin film transistors or the like. But, from a performance aspect, the research works seem to have reached a plateau. The major reason is that the mobility of carriers is low in amorphous semiconductors which essentially contains many defects. As a new potential material which can break through the current situation, a great attention is paid to amorphous semiconductor superlattices.

The amorphous semiconductor superlattice is a structure consisting of alternating layers of two amorphous semiconductor materials which are different either in composition and band gap or in doped impurity, each layer having a thickness of several angstroms to several tens angstroms. For brevity of description, two different amorphous semiconductor layers are designated layers A and B, hereinafter. Amorphous semiconductor superlattice thin films are prepared in the prior art by plasma- or light-excited chemical vapor deposition (CVD). One commonly used method is by mechanically switching the supply of reactant gases to alternately deposit layers A and B. More particularly, a reactant gas from which layer A is deposited is first introduced into a reaction chamber where the reactant is excited and decomposed by light or plasma to thereby deposit layer A until the desired film thickness is reached. The feeding of reactant gas is stopped and the reaction chamber is evacuated. Thereafter, another reactant gas from which layer B is deposited is introduced into the reaction chamber where layer B is similarly deposited until the desired film thickness is reached. The reaction chamber is again evacuated to avoid the cross contamination at the bounding of two layers. A superlattice thin film is prepared by repeating this procedure the predetermined cycles. For example, a structure of alternating layers of a-Si (amorphous-Si) and a-SiC (amorphous-SiC) can be prepared by carrying out decomposition of a silicon-containing reactant to deposit a-Si and then carrying out decomposition of a mixture of a silicon-containing reactant and a carbon-containing reactant to deposit a-SiC. A superlattice thin film is obtained by repeating this procedure.

These prior art methods for forming superlattice thin films by plasma- or light-excited CVD, however, essentially require mechanical switch-over of reactant gases. Every time the reaction to form a film of one type is completed, the reaction chamber is purged of the reactant gas. The need for vacuum operation after every film formation results in inefficient production of a superlattice film.

In the above-described methods requiring switch-over of reactant gases, deposition of one layer is essentially one process of operation. Preparation of a superlattice thin film which is a multilayer laminate film thus requires a number of processes, presenting a bar against commercial application.

An alternative method uses a reaction chamber for forming layer A and another reaction chamber for forming layer B. The two chambers are juxtaposed through a partition. A rotor is provide in association with the partition such that the rotor moves at a predetermined speed back and forth between the two chambers while rotating. A substrate rests on the rotor. Then the substrate is moved into and out of the two chambers alternately with the rotation of the rotor whereby layers A and B are alternately formed on the substrate. This method, however, is also inefficient.

SUMMARY OF THE INVENTION

Therefore, one object of the present invention is to provide a novel and improved process for forming multilayer thin films in a single reaction chamber.

Another object of the present invention is to provide a novel and improved process for forming multilayer thin films in a single reaction chamber without the need for repeating introduction and removal of a reactant gas.

A further object of the present invention is to provide an improved process for forming amorphous semiconductor superlattice thin films in a single reaction chamber in a simple and efficient manner.

A still further object of the present invention is to provide a process for forming multilayer thin films which can be advantageously used in forming amorphous semiconductor superlattice thin films applicable in solar cells, optical sensors, photosensitive drums, light-emitting elements and thin film transistors.

According to the present invention, there is provided a process for forming a multilayer thin film comprising the steps of:

introducing a mixture of a first gas reactant with which one of plasma-excited chemical reaction and light-excited chemical reaction can take place or one preferentially takes place and a second gas reactant having a different reactivity with respect to the chemical reactions than said first reactant, for example, a reactant with which both the reactions can take place, into a reaction chamber in which a substrate is placed, discontinuously carrying out one of plasma-excited chemical reaction and light-excited chemical reaction in the reaction chamber exclusively or preferentially, and carrying out the other chemical reaction discontinuously in a different time phase than the one chemical reaction or continuously, thereby alternately depositing on the substrate a thin film layer which is formed when the one chemical reaction is carried out and another thin film layer which is formed when the one chemical reaction is interrupted, thereby forming a thin film of alternately deposited layers.

In order to continuously form a multilayer thin film such as a superlattice without discontinuing the supply of gas reactants, the present invention utilized the difference in chemical reactivity between two or more reactants. Two different power sources are concurrently used to excite the reactants, for example, a light source capable of producing an exciting energy with narrow distribution such as a low-pressure mercury lamp and an excimer laser and an electric discharge plasma capable of emitting high speed electrons with wide energy distribution, for instance, ranging beyond 10 eV. One of the plasma and light excitation energies is discontinuously applied to the reaction chamber containing a mixture of gases having different chemical reactivity. The other excitation energy is applied discontinuously in a different time phase than the one excitation time phase or continuously. Then, a thin film layer which is formed when the one excitation energy is applied and another thin film layer which is formed when the one excitation energy is interrupted are alternately deposited to form a thin film of alternately deposited layers. For example, a reactant which can be decomposed both with light and with plasma and another reactant which can be decomposed with plasma, but not with light are selected as the gas reactants. A mixture of these gas reactants is constantly fed into the reaction chamber where light is continuously irradiated and an electric discharge is turned on and off at predetermined intervals to produce plasma pulses. Then CVD based solely on light and CVD based on combined light and plasma excitation are successively carried out at the predetermined intervals in the same reaction chamber. A layer resulting from CVD based solely on light is formed when the electric discharge is turned off, and a layer of a combined composition resulting from the both reactants is formed when the electric discharge is turned on.

According to the present invention, a multilayer thin film of desired compositions may be produced by selecting a particular gas mixture and a particular reaction mode. Since a gas mixture of reactants from which the respective layers are formed may be continuously fed during the process, there is no need for repeating introduction and purging of gas reactants. Since only one reaction chamber suffices, there is no need for exchanging two reaction chambers. A multilayer thin film can be readily formed in an efficient simple manner. A less complicated, less expensive apparatus may be used.

A superlattice film produced by the present process has improved semiconductor properties over a single layer film which has the same composition as the superlattice film as averaged. For example, the superlattice film has much higher photoconductivity as compared with a conventional bulk film having an equivalent optical band gap or each single one of the laid-up layers. Since both plasma and light excitations can be used in one of the two repeating time phases, the structure and quality of superlattices prepared by thus method can be improved as compared with those prepared by the conventional gas-exchange and single excitation method. The present invention thus provides amorphous semiconductor superlattice films which exhibit improved properties when utilized in solar cells, photosensors, photosensitive drums, light-emitting elements, and thin-film transistors.

BRIEF DESCRIPTION OF THE DRAWINGS

The objects, features, and advantages of the present invention will be better understood by reading the following description taken in conjunction with the accompanying drawings, in which.

DETAILED DESCRIPTION OF THE INVENTION

Figure 1:
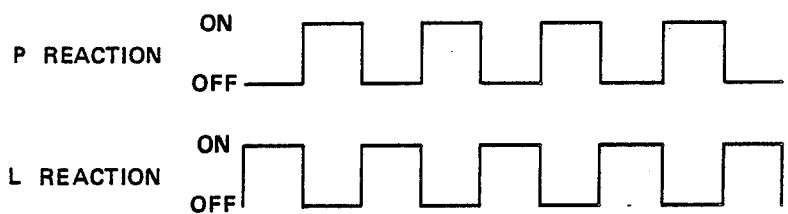
FIGS. 1 to 3 are diagrams showing different reaction modes taken in the process of the present invention.

The multilayer thin film forming process of the present invention utilizes plasma-excited chemical reaction (simply referred to as P-reaction) and light-excited chemical reaction (simply referred to as L-reaction) so as to alternately and successively form two types of thin films having different compositions or band gaps in a common reaction chamber. At the outset, the reaction chamber is charged with a mixture of (a) a first gas reactant with which only either one of plasma-excited chemical reaction and light-excited chemical reaction can take place or either one preferentially takes place (plasma-excited chemical reaction takes place more than light-excited chemical reaction does or light-excited chemical reaction takes place more than plasma-excited chemical reaction does) and (b) a second gas reactant having a different reactivity with respect to the chemical reactions than the first reactant.

Illustrative examples of the gas mixture used herein are given below.

(1) A mixture of a reactant with which only P-reaction can take place or P-reaction preferentially takes place and another reactant with which only L-reaction can take place or L-reaction preferentially takes place. The film obtained from the former reactant should be different from the film obtained from the latter reactant.

(2) A mixture of a reactant with which only P-reaction can take place or P-reaction preferentially takes place and another reactant with which both P- and L-reactions can take place. The film obtained from the former reactant should be different from the film obtained from the latter reactant.

(3) A mixture of a reactant with which only L-reaction can take place or L-reaction preferentially takes place and another reactant with which both P- and L-reactions can take place. The film obtained from the former reactant should be different from the film obtained from the latter reactant.

In the practice of the present invention, an electric discharge plasma capable of producing high-speed electrons to carry out excitation with a high energy of at least 10 electronvolts, particularly 10 to 20 electronvolts, may preferably be used for P-reaction. For example, DC or RF induction coupling or capacity coupling type plasma CVD apparatus and microwave CVD apparatus may be employed. A light source capable of producing a monochromatic or narrowly distributed exicitation energy may preferably used for L-reaction. For example, a low-pressure mercury lamp, an excimer laser, and a ultraviolet radiation source such as a deuterium discharge tube and a rare gas discharge tube may be employed. L-reaction is preferably carried out by utilizing photochemical reaction induced by light having a wavelength in the range of from 100 to 300 nm.

The gaseous reactants with which P-reaction and/or L-reaction can take place or preferentially takes place are those which can be reacted by the above-described reaction inducing means to form a thin film.

It is now assumed that plasma CVD is a typical P-reaction and mercury sensitized light CVD is a typical L-reaction. The gas reactant with which only P-reaction can take place or P-reaction takes place preferentially as compared with L-reaction includes $CF_4$, $CH_4$, $SiF_4$, $BF_3$, $NF_3$, $N_2$ and the like. One or more of these reactants may be selected depending on the desired type of thin film to be formed. The gas reactant with which only L-reaction can take place or L-reaction takes place preferentially as compared with P-reaction includes $GeF_4$, $GeH_4$, and the like, and a mixture of two or more of them. The gas reactant with which both P- and L-reactions can take place includes $SiH_4$, $Si_2H_6$, $Si_3H_8$, $SiHnR_{(4-n)}$, $SiHnF_{(4-n)}$, $AlR_3$, $GeR_3$, $ZnR_2$, $SnR_4$, and the like, and a mixture of two or more of them wherein n is equal to 1,2 or 3 and R is an alkyl or aryl group which may have 1 to 7 carbon atoms, particularly 1 to 4 carbon atoms in case of alkyl group and 6 to 7 carbon atoms in case of aryl group. Since the term L-reaction used in the present specification encompasses dark reaction wherein once induced by exposure to light, reaction is sustainable even after light exposure is interrupted, a gas reactant capable of dark reaction may also be used. Examples of the reactant capable of dark reaction are $SiH_4+O_2$, $Al(CH_3)_3$, etc.

In the practice of the present invention, a gas mixture selected from the above-mentioned mixtures (1), (2) and (3) is introduced into a reaction chamber at a pressure between 0.01 and 100 Torrs. At least either one chemical reaction of P- and L-reactions is discontinuously carried out while the other chemical reaction is carried out discontinuously in a different time phase than the one chemical reaction or continuously.

The reaction modes contemplated herein are described below.

(a) P-reaction and L-reaction are alternately carried out as shown in FIG. 1. The process may be carried out by switching over P-reaction and L-reaction either instantaneously such that substantially no non-reaction state exists or with a time lag such that a non-reaction state is created between P-reaction and L-reaction. Partial overlapping of P-reaction and L-reaction is also permissible.

Figure 2:
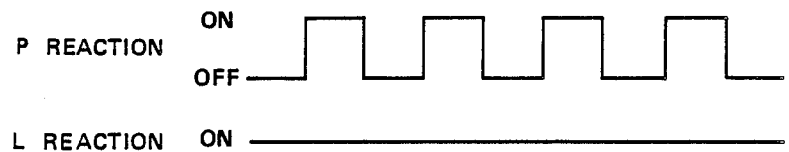

(b) P-reaction is discontinuously carried out while L-reaction is continuously carried out as shown in FIG. 2.

Figure 3:
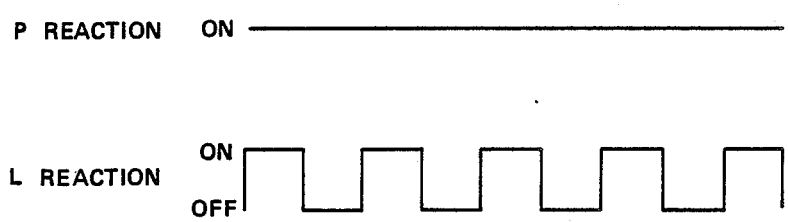

(c) L-reaction is discontinuously carried out while P-reaction is continuously carried out as shown in FIG. 3.

The reaction time intervals (terms) as well as the non-reaction time intervals (terms) may very depending on the multilayer thin films required, although they may be usually 0.1 seconds to 20 minutes, preferably 1 seconds to 10 minutes.

It should be understood that modifications and changes of reaction modes (a) to (c) may be made in various ways. For example, in reaction modes (b) and (c), the continuous reaction may be continuous during the entire period of multilayer thin film formation, or have a quiescent time during the entire period of multilayer thin film formation (the continuous reaction itself is carried out discontinuously). Further, in the quiescent time of the continuous reaction, P- or L-reaction may be carried out.

Figure 4:
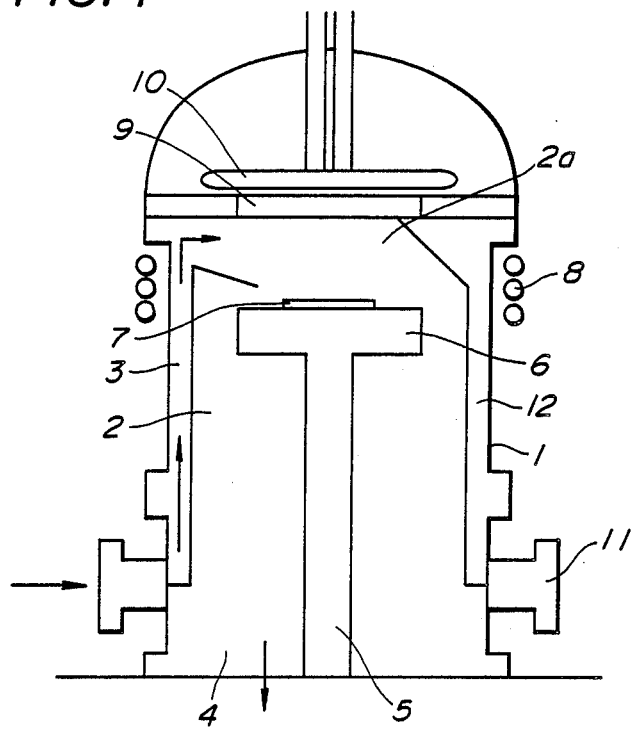
FIG. 4 is a schematic illustration of a reaction apparatus used in the practice of the present invention.

The reaction apparatus is designed such that either one of these reaction modes is performed in the reaction chamber. More particularly, an apparatus for forming a multilayer thin film can comprise a reaction chamber, means for supporting a substrate in the reaction chamber, supply means for introducing into the reaction chamber a first gas reactant with which one of plasma-excited chemical reaction and light-excited chemical reaction can take place or one preferentially takes place and a second gas reactant having a different reactivity with respect to the chemical reactions than said first reactant, means associated with the reaction chamber for producing a plasma therein, means associated with the reaction chamber for emitting light therein, and control means for activating said plasma producing means and said light emitting means such that one of said plasma producing means and said light emitting means is discontinuously activated and the other is activated discontinuously in a different time phase than the one or continuously. The reaction control may be carried out using a computer of a well-known electric circuit. For example, reaction mode (b) is performed using continuously emitting light and pulsated plasma as exciting sources. Pulse sequence may be either fixed or modulated during the process. One illustrative example of the reaction apparatus used herein is shown in FIG. 4 as will be described later, but the apparatus is not limited thereto.

A gas mixture of reactants can be bed continuously without interrupting to thereby form a multilayer thin film in a continuously manner. If desired, however, a reactant mixture may be fed discontinuously or the composition of a mixture may be changed either at an intermediate point or continuously during the process.

The conditions under which P- and L-reactions are carried out may be those well known for the respective reactions. P- and L-reactions may be carried out by their well-known conventional processes which employ such conditions as a substrate temperature between ambient and 500° C., a total pressure of gases, which may be diluted with hydrogen or rare gas(es), between 0.01 and 100 Torrs, RF (13.56 MHz) electric power density of 0.01 to 100 W/cm², and mercury vapor pressure of 0 to 0.2 Torrs.

The substrate on which a thin film is deposited is not particularly limited and is selected from a wide variety of materials. In forming a superlattice film, for example, glass, ceramics, metal, and a flexible substrate such as a polymeric film may be used.

In the practice of the present invention, by suitably combining gas mixture (1), (2) or (3) with reaction mode (a), (b) or (c) as described above, a thin film which is formed when one chemical reaction is carried out and another thin film wwhich is formed when one chemical reaction is interrupted are alternately and sequentialy deposited one on another. There is obtained a desired multilayer thin film consisting of alternating thin film layers having different compositions or band gaps.

The lamination number may vary depending on the multilayer thin films required. Usually, the films may have 2 to 400 layers, preferably 2 to 200 layers and each layer may have a thickness of 5 Å to 500 Å, preferably 10 Å to 200 Å, although the thickness of the layer is not limited thereto. For example, the film of 100 alternating layers consisting of 50 layers resulting from one reaction and 50 layers resulting from another reaction, each layer being about 50 Å thick, can be obtained by the invention.

More particularly, a combination of gas mixture (2) with reaction mode (b) will be described as one embodiment. As described above, gas mixture (2) is a mixture of a first reactant with which only P-reaction can take place or P-reaction preferentially takes place and a second reactant with which both P- and L-reactions can take place. In the duration when plasma discharge is interrupted, the second reactant is decomposed under the action of light so that a thin film resulting from L-reaction of second reactant is deposited. When plasma discharge is turned on, both the first and second reactants are excited thereby so that a thin film resulting from both the reactants is deposited, which has a different composition or band gap than the former thin film.

EXAMPLE 1

Example of the present invention are presented below by way of illustration and not by way of limitation.

A multilayer thin film was formed using a reaction apparatus as shown in FIG. 4. The apparatus generally designated at 1 is a vertical cylindrical apparatus and includes a reaction chamber 2 defined within the apparatus, a passage 3 through which a reactant mixture is introduced, and an exhaust port 4. A rotor 5 is rotatably disposed in the reaction chamber 2. The rotor 5 at the top has a disk 6 on which a substrate 7 rests. Outside an upper portion 2a of the reaction chamber 2 above the disk 6 which defines a plasma-forming plenum, is disposed an RF (13.56 MHz) pulse oscillator 8 of induction coupling type which is controlledly turned on and off by a computer (not shown). A plasma is created in the plenum 2a by turning on the oscillator 8. Above the plasma-forming plenum 2a is disposed a low-pressure mercury lamp 10 via a window 9 of synthetic quartz. The lamp 10 is kept turned on during the entire thin film formation period to emit light toward the plenum 2a through the window 9. A gas mixture passes through the passage 3 into the chamber 2 and then exits the exhaust port 4 as shown by arrows in the figure. It is to be noted that an inert gas is introduced from an inlet 11 toward the window 9 through a passage 12 in order to prevent the window 9 from fogging.

In the illustrated apparatus, a multilayer thin film was formed under the following conditions.

Conditions

| Gas mixture (sccm = standard cubic centimeter) | |
| --- | --- |
| $Si_2H_6$ | 3.0 sccm |
| $CF_4$ | 60.0 sccm |
| Pressure | 700 mTorr |
| Substrate temperature | 300° C. |
| Plasma power | 30 watts |
| Plasma | on 33 sec., off 58 sec. 10 cycles |
| UV wavelength | 185 nm, 254 nm |
| Substrate | Corning 7059 glass silicon wafer (single crystal) |

In this procedure, when the plasma is turned off, only disilane ($Si_2H_6$) is decomposed with light to form a thin film consisting of Si and H. When the plasma is turned on, both disilane ($Si_2H_5$) and tetrafluorocarbon ($CF_4$) are excited to form a thin film consisting of Si, C, H and F.

The resulting thin films had the following physical properties.

The film formed when plasma is off (film resulting from only L-reaction, control).

| Thickness (1 hour reaction) | 3100 Å |
| --- | --- |
| Composition (amorphous Si) | Si:96% H:4% |
| Optical band gap | 1.80 eV |
| Dark conductivity | $6.40 \times 10^{-11}$ S. cm$^{-1}$ |
| Photoconductivity | $8.56 \times 10^{-6}$ S. cm$^{-1}$ |

The film formed when plasma is on (film resulting from both L- and P-reactions, control).

| Thickness (1 hour reaction) | 5500 Å |
| --- | --- |
| Composition (amorphous SiC) | Si:57% C:11% H:28% F:4% |
| Optical band gap | 2.35 eV |
| Dark conductivity | $1.12 \times 10^{-8}$ S. cm$^{-1}$ |
| Photoconductivity | $2.40 \times 10^{-7}$ S. cm$^{-1}$ |

The film of 20 alternating layers consisting of 10 layers resulting from only L-reaction and 10 layers resulting from both L- and P-reactions, each layer being 50 Å thick (superlattice film, present invention).

| Thickness | 1000 Å |
| --- | --- |
| Optical band gap | 2.05 eV |
| Dark conductivity | $1.69 \times 10^{-8}$ S. cm$^{-1}$ |
| Photoconductivity | $6.18 \times 10^{-5}$ S. cm$^{-1}$ |

Figure 5:
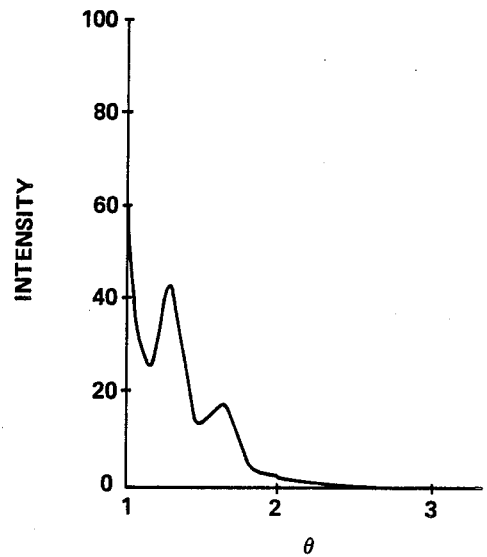
FIG. 5 is a X-ray diffraction spectrum of a multilayer thin film prepared by the process of the present invention.

A superlattice film was similarly prepared as above and analyzed by X-ray diffraction. The X-ray diffraction spectrum of a-Si (50 Å) 41 layers/a-SiC (50 Å) 40 layers is shown in FIG. 5. The diagram of FIG. 5 clearly shown that the layers of the superlattice film are regularly placed at the preset thickness.

It is seen that a superlattice thin film can be prepared in a continuous manner without switching-over of gas feed by using a reactant which is excited by a plasma, but not decomposed with light in combination with a reactant which is excited and decomposed by a plasma and light, continuously exposing the reactants to light, and discontinuously producing a plasma. The superlattice film prepared by the above-described process has improved semiconductor properties over a single-layer film having the same composition as the average of the superlattice film. More specifically, the photoconductivity of the superlattice film is higher by aat least one order than that of a conventional bulk a-SiC film having an equivalent optical band gap. The photoconductivity of the superlattice film is higher than that of a single a-Si layer or a single a-SiC layer. It is evident that the process of the present invention ensures the production of a superlattice film having improved semiconductor characteristics based on the quantum effect inherent to the superlattice.

EXAMPLE 2

In the apparatus described above, a multilayer thin film was formed under the following conditions.

Conditions

| Gas mixture | |
| --- | --- |
| $Si_2H_6$ | 3.0 sccm |
| $CH_4$ | 60.0 sccm |
| Pressure | 700 mTorr |
| Substrate temperature | 300° C. |
| Plasma power | 30 watts |
| Plasma | on 94 sec., off 151 sec. |
| UV wavelength | 185 nm, 254 nm |
| Substrate | Corning 7059 glass silicon wafer (single |

-continued crystal)

In this procedure, when the plasma is turned off, only disilane ($Si_2H_6$) is decomposed with light (only L reaction proceeds) to form a thin film consisting of Si and H (amorphous Si). When the plasma is turned on, both disilane ($Si_2H_6$) and tetrahydrocarbon ($CH_4$) are excited (both L and P reactions proceed) to form a thin film consisting of Si, C and H (amorphous SiC).

The resulting thin films had the following physical properties.

The film formed when plasma is off (film resulting from only L-reaction, control).

| Thickness (90 minutes reaction) | 2900 Å |
| Optical band gap | 1.78 eV |
| Dark conductivity | $8.67 \times 10^{-11}$ S. cm$^{-1}$ |
| Photoconductivity | $2.50 \times 10^{-6}$ S. cm$^{-1}$ |

The film when plasma is on (film resulting from both L- and P-reactions, control).

| Thickness (120 minutes reaction) | 2400 Å |
| Optical band gap | 2.13 eV |
| Dark conductivity | $3.07 \times 10^{-11}$ S. cm$^{-1}$ |
| Photoconductivity | $1.22 \times 10^{-7}$ S. cm$^{-1}$ |

The film of 20 alternating layers consisting of 10 layers resulting from only L-reaction and 10 layers resulting from both L- and P-reactions, each layer being 50 Å thick (superlattice film, present invention).

| Thickness | 1000 Å |
| Optical band gap | 1.90 eV |
| Dark conductivity | $7.77 \times 10^{-9}$ S. cm$^{-1}$ |
| Photoconductivity | $3.25 \times 10^{-5}$ S. cm$^{-1}$ |

EXAMPLE 3

In the apparatus described above, a multilayer thin film was formed under the following conditions.

Conditions

| Gas mixture | |
| --- | --- |
| SiF$_4$ | 78 sccm |
| GeH$_4$ | 0.15 sccm |
| H$_2$ | 7.35 sccm |
| Ar | 15 sccm |
| Pressure | 1.0 Torr |
| Substrate temperature | 300° C. |
| Plasma power | 40 watts |
| Plasma | on 67 sec., off 455 sec. 10 cycles |
| UV wavelength | 185 nm, 254 nm |
| Substrate | Corning 7059 glass silicon wafer (single crystal) |

In this procedure, when the plasma is turned off, SiF$_4$ is not excited with light and only a thin film consisting of Ge and H (amorphous Ge) is formed. When the plasma is turned on, SiF$_4$ is also excited to form a thin film consisting of Si, Ge, H and F (amorphous SiGe).

The resulting thin films had the following physical properties.

The film formed when plasma is off (film resulting from only L-reaction, control).

| Thickness (120 minutes reaction) | 1500 Å |
| Optical band gap | 0.82 eV |
| Dark conductivity | $2.33 \times 10^{-4}$ S. cm$^{-1}$ |
| Photoconductivity | $2.35 \times 10^{-4}$ S. cm$^{-1}$ |

The film formed when plasma is on (film resulting from both L- and P-reactions, control).

| Thickness (60 minutes reaction) | 7200 Å |
| Optical band gap | 1.56 eV |
| Dark conductivity | $1.27 \times 10^{-11}$ S. cm$^{-1}$ |
| Photoconductivity | $3.60 \times 10^{-7}$ S. cm$^{-1}$ |

The film of 20 alternating layers consisting of 10 layers resulting from only L-reaction and 10 layers resulting from both L- and P-reactions, each layer being 50 Å thick (superlattice film, present invention).

| Thickness | 1000 Å |
| Optical band gap | 1.25 eV |
| Dark conductivity | $1.56 \times 10^{-7}$ S. cm$^{-1}$ |
| Photoconductivity | $2.76 \times 10^{-7}$ S. cm$^{-1}$ |

It is also seen from Examples 2 and 3 that a superlattice thin film can be prepared in a continuous manner without switching-over of gas feed by using a reactant which is excited by a plasma, but not decomposed with light in combination with a reactant which is excited and decomposed by a plasma and light, continuously exposing the reactants to light, and discontinuously producing a plasma. The superlattice film prepared by the above-described process has improved semiconductor properties over a single-layer film having the same composition as the average of the superlattice film.

We claim:

1. A process for forming a multilayer thin film comprising the steps of:
  (i) introducing a mixture of (ia) a first gas reactant with which one of plasma-excited chemical reaction and light-excited chemical reaction can take place or one preferentially takes place and (ib) a second gas reactant having a different reactivity with respect to the chemical reactions than said first reactant into a reaction chamber in which a substrate is placed,
  (ii) discontinuously carrying out one of said plasma-excited chemical reaction and said light-excited chemical reaction in the reaction chamber exclusively or preferentially, and
  (iii) carrying out the other chemical reaction discontinuously in a different time phase than the one chemical reaction or continuously,
  thereby alternately depositing on the substrate a thin film layer which is formed when the one chemical reaction is carried out and another thin film layer which is formed when the one chemical reaction is interrupted, thereby forming a thin film of alternately deposited layers;
  wherein said plasma-excited chemical reaction is discontinuously carried out while said light-excited chemical reaction is continuously carried out, or wherein said light-excited chemical reaction is discontinuously carried out while said plasma-excited chemical reaction is continuously carried out.

2. The process of claim 1, wherein said plasma excited chemical reaction and said light-excited chemical reaction are alternately carried out.

3. The process of claim 1, wherein said plasma-excited chemical reaction is discontinuously carried out while said light-excited chemical reaction is continuously carried out.

4. The process of claim 1, wherein said light-excited chemical reaction is discontinuously carried out while said plasma-excited chemical reaction is continuously carried out.

5. The process of claim 1, wherein said mixture consists of disilane and tetrafluorocarbon.

6. A process for forming a multilayer thin film comprising the steps of:
(i) introducing a mixture of (ia) a first gas reactant with which one of a plasma-excited chemical reaction and a light-excited chemical reaction can take place or one preferentially takes place, and (ib) a second gas reactant having a different reactivity with respect to the chemical reactions than said first reactant into a reaction chamber in which a substrate is placed,
(ii) discontinuously carrying out one of said plasma-excited chemical reaction and said light-excited chemical reaction in the reaction chamber exclusively or preferentially, and
(iii) carrying out the other chemical reaction discontinuously in a different time phase than the one chemical reaction, or continuously, thereby alternately depositing on the substrate a thin film layer which is formed when the one chemical reaction is carried out and another thin film layer which is formed when the one chemical reaction is interrupted, thereby forming a thin film of alternately deposited layers;
wherein said mixture consists of a first reactant with which only said plasma-excited chemical reaction can take place or said plasma-excited chemical reaction preferentially takes place and a second reactant with which only said light-excited chemical reaction can take place or said light-excited chemical reaction preferentially takes place.

7. The process of claim 6, wherein said plasma excited chemical reaction and said light-excited chemical reaction are alternately carried out.

8. The process of claim 6, wherein said plasma-excited chemical reaction is discontinuously carried out while said light-excited chemical reaction is continuously carried out.

9. The process of claim 6, wherein said light-excited chemical reaction is discontinuously carried out while said plasma-excited chemical reaction is continuously carried out.

10. The process of claim 6, wherein said mixture consists of disilane and tetrafluorocarbon.

11. A process for forming a multilayer thin film comprising the steps of:
(i) introducing a mixture of (ia) a first gas reactant with which one of a plasma-excited chemical reaction and a light-excited chemical reaction can take place or one preferentially takes place and (ib) a second gas reactant having a different reactivity with respect to the chemical reactions than said first reactant into a reaction chamber in which a substrate is placed,
(ii) discontinuously carrying out one of said plasma-excited chemical reaction and said light-excited chemical reaction in the reaction chamber exclusively or preferentially, and
(iii) carrying out the other chemical reaction discontinuously in a different time phase than the one chemical reaction, or continuously, thereby alternately depositing on the substrate a thin film layer which is formed when the one chemical reaction is carried out and another thin film layer which is formed when the one chemical reaction is interrupted, thereby forming a thin film of alternately deposited layers;
wherein said mixture consists of a first reactant with which only said plasma-excited chemical reaction can take place or said plasma-excited chemical reaction preferentially takes place and a second reactant with which both said plasma- and said light-excited chemical reactions can take place.

12. The process of claim 11, wherein said plasma excited chemical reaction and said light-excited chemical reaction are alternately carried out.

13. The process of claim 11, wherein said plasma-excited chemical reaction is discontinuously carried out while said light-excited chemical reaction is continuously carried out.

14. The process of claim 11, wherein said light-excited chemical reaction is discontinuously carried out while said plasma-excited chemical reaction is continuously carried out.

15. The process of claim 11, wherein said mixture consists of disilane and tetrafluorocarbon.

16. A process for forming a multilayer thin film comprising the steps of:
(i) introducing a mixture of (ia) a first gas reactant with which one of a plasma-excited chemical reaction and a light-excited chemical reaction can take place or one preferentially takes place and (ib) a second gas reactant having a different reactivity with respect to the chemical reactions than said first reactant into a reaction chamber in which a substrate is placed,
(ii) discontinuously carrying out one of said plasma-excited chemical reaction and said light-excited chemical reaction in the reaction chamber exclusively or preferentially, and
(iii) carrying out the other chemical reaction discontinuously in a different time phase than the one chemical reaction, or continuously, thereby alternately depositing on the substrate a thin film layer which is formed when the one chemical reaction is carried out and another thin film layer which is formed when the one chemical reaction is interrupted, thereby forming a thin film of alternately deposited layers;
wherein said mixture consists of a first reactant with which only said light-excited chemical reaction can take place or said light-excited chemical reaction preferentially takes place and a second reactant with which both said plasma- and said light-excited chemical reactions can take place.

17. The process of claim 16, wherein said plasma excited chemical reaction and said light-excited chemical reaction are alternately carried out.

18. The process of claim 16, wherein said plasma-excited chemical reaction is discontinuously carried out while said light-excited chemical reaction is continuously carried out.

19. The process of claim 16, wherein said light-excited chemical reaction is discontinuously carried out while said plasma-excited chemical reaction is continuously carried out.

20. The process of claim 16, wherein said mixture consists of disilane and tetrafluorocarbon.

21. The process of claim 1, wherein said plasma-excited chemical reaction is discontinuously carried out while said light-excited chemical reaction is continuously carried out, and wherein said mixture consists of disilane and tetrafluorocarbon.

22. The process of claim 1, wherein said light-excited chemical reaction is discontinuously carried out while said plasma-excited chemical reaction is continuously carried out, and wherein said mixture consists of disilane and tetrafluorocarbon.

* * * * *